(12) United States Patent
Cao et al.

(10) Patent No.: US 8,137,457 B2
(45) Date of Patent: Mar. 20, 2012

(54) ONE-POT SYNTHESIS OF HIGH-QUALITY METAL CHALCOGENIDE NANOCRYSTALS WITHOUT PRECURSOR INJECTION

(75) Inventors: Yunwei Charles Cao, Gainesville, FL (US); Ou Chen, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 761 days.

(21) Appl. No.: 12/249,586

(22) Filed: Oct. 10, 2008

(65) Prior Publication Data
US 2009/0084307 A1    Apr. 2, 2009

Related U.S. Application Data

(63) Continuation-in-part of application No. 11/188,352, filed on Jul. 25, 2005, now Pat. No. 7,465,352.

(60) Provisional application No. 60/590,876, filed on Jul. 23, 2004.

(51) Int. Cl.
C30B 11/00    (2006.01)
C30B 7/00     (2006.01)
C30B 21/02    (2006.01)
C30B 28/06    (2006.01)

(52) U.S. Cl. ............. 117/11; 117/68; 117/906; 117/912

(58) Field of Classification Search .................... 117/11, 117/68, 906, 912
See application file for complete search history.

(56) References Cited

U.S. PATENT DOCUMENTS

| 7,144,458 B2 * | 12/2006 | Zehnder et al. ............ 117/68 |
| 7,465,352 B2 * | 12/2008 | Cao .......................... 117/68 |
| 2002/0066401 A1 * | 6/2002 | Peng et al. ................. 117/68 |
| 2003/0173541 A1 * | 9/2003 | Peng et al. ............. 252/301.4 R |
| 2004/0086444 A1 * | 5/2004 | Green ........................ 423/266 |
| 2005/0022726 A1 * | 2/2005 | Wong et al. ................. 117/105 |

FOREIGN PATENT DOCUMENTS

| WO | WO 01/07689 | 2/2001 |
| WO | WO 02/47117 | 6/2002 |

OTHER PUBLICATIONS

Talapin, D.V. et al., "Synthesis and surface modification of amino-stabilized CdSe, CdTe and InP nanocrystals," *Colloids and Surfaces A: Physicochemical and Engineering Aspects*, 2002, pp. 145-154, vol. 202.

* cited by examiner

*Primary Examiner* — James McDonough
(74) *Attorney, Agent, or Firm* — Saliwanchik, Lloyd & Eisenschenk

(57) ABSTRACT

A method of forming monodisperse metal chalcogenide nanocrystals without precursor injection, comprising the steps of: combining a metal source, a chalcogen oxide or a chalcogen oxide equivalent, and a fluid comprising a reducing agent in a reaction pot at a first temperature to form a liquid comprising assembly; increasing the temperature of the assembly to a sufficient-temperature to initiate nucleation to form a plurality of metal chalcogenide nanocrystals; and growing the plurality of metal chalcogenide nanocrystals without injection of either the metal source or the chalcogen oxide at a temperature equal to or greater than the sufficient-temperature, wherein crystal growth proceeds substantially without nucleation to form a plurality of monodisperse metal chalcogenide nanocrystals. Well controlled monodispersed CdSe nanocrystals of various sizes can be prepared by choice of the metal source and solvent system.

15 Claims, 14 Drawing Sheets

Table 1 Compositional details of a 0.1 mmol Cd salt and 0.1 mmol SeO$_2$ in 6.3 mL ODE mixture

| Sample | Cd salt | Added Cd salt | Added solvent | Growth Rate (nm/h) |
|---|---|---|---|---|
| a | Cd docosanate | | 0.1 mmol HDD | 2.7 |
| b | Cd docosanate | | | 3.2 |
| c | Cd myristate | | 0.1 mmol HDD | 3.5 |
| d | Cd myristate | | | 4 |
| e | Cd myristate | 4.9 µmol Cd acetate | | 4.6 |
| f | Cd myristate | 8.7 µmol Cd acetate | | 5.1 |

ONE-POT SYNTHESIS OF HIGH-QUALITY METAL CHALCOGENIDE NANOCRYSTALS WITHOUT PRECURSOR INJECTION

CROSS-REFERENCE TO RELATED APPLICATION(S)

The present application is a continuation-in-part of U.S. application Ser. No. 11/188,352, filed on Jul. 25, 2005, which claims the benefit of U.S. Provisional Application Ser. No. 60/590,876, filed Jul. 23, 2004, both of which are hereby incorporated by reference herein in their entirety, including any figures, tables, or drawings.

The subject invention was made with government support under a research project supported by National Science Foundation, Contract No. DMR-0645520. The government has certain rights to this invention.

BACKGROUND OF THE INVENTION

The formation of high-quality semiconductor nanocrystals, with well-controlled size and shape as well as well-confined surface passivation, can be achieved by controlling the thermodynamics and kinetics during the nucleation and growth of nanocrystals. However, the separation of the nucleation and growth stages is a prerequisite for producing high-quality nanocrystals which generally require uniform shape and a tight size distribution. When nucleation occurs concurrently with the growth of nanocrystals, a broad nanocrystal size distribution generally results.

In colloidal synthesis, methods are known which separate the nucleation stage from the nanocrystal growth stage. The key part of this synthetic method is the injection of room-temperature organometallic precursors into well-stirred, hot organic solvents. Nucleation takes place immediately after the injection and continues until the temperature and the precursor concentration both drop below critical threshold levels. In this case, the nucleation time is determined by the rate of the precursor injection and the mass transfer in the reaction system. Therefore, rapid precursor injection and strong stirring leads to a short nucleation time, and thus achieves a separation between nucleation and growth stages. This method has led to synthesis of a variety of high-quality nanocrystals ranging from II-VI (e.g., CdS and CdSe) and III-V (e.g., InP and InAs) to IV-VI (e.g., PbS and PbSe) semiconductors, which are of great importance to applications including biological labeling, LEDs, lasers, and solar cells.

However, the injection-based synthetic method is not suitable for large-scale, industrial preparation (e.g., hundreds of kilograms), even though it can be scaled up to the order of grams. Industrial preparation of nanocrystals requires batch reactors that can be tens of thousands of times larger than those in research laboratories. In this industrial case, the rapid injection of precursors needed to separate nucleation and growth is very difficult to achieve. Moreover, the limitations of mass transfer in the industrial reactors further diminish the merits of the injection method. Therefore, the injection-based synthetic method cannot produce high-quality nanocrystals on an industrial scale. To overcome this difficulty, new synthetic methods that do not require the injection of precursors are needed.

The formation of high-quality nanocrystals is often favored at high temperatures (e.g., >200° C.). This creates a major challenge for making monodispersed nanocrystals through a non-injection-based synthesis, because such a synthesis involves a period of increasing temperature over a broad range, such as from room temperature to over 200° C. This broad temperature range often leads to concurrent nucleation and growth of nanocrystals in the syntheses, and results in products with poor monodispersity. Thus, although some reports have detailed one-pot synthesis of semiconductor nanocrystals without precursor injection, the quality (in terms of shape and size distribution) of the nanocrystal product is not comparable to that of the nanocrystals made by the precursor injection method. For example, nanocrystals made without precursor injection exhibit optical properties that are inferior to those produced by the injection method, such as providing fewer exciton absorption peaks, which are critical for nanocrystal applications in advanced optical and electronic devices.

SUMMARY OF THE INVENTION

Monodisperse metal chalcogenide nanocrystals are formed without precursor injection by combining a metal source, a chalcogen oxide or its equivalent, and a fluid that contains at least one reducing agent in one pot at a first temperature to form a liquid comprising assembly. The pot is increased in temperature to a sufficient-temperature where nucleation is initiated to form a plurality of metal chalcogenide nanocrystals. Growth of the plurality of metal chalcogenide nanocrystals ensues without injection of either the metal source or the chalcogen oxide at a temperature equal to or greater than the sufficient-temperature such that no substantial amount of additional nucleation occurs and a plurality of monodisperse metal chalcogenide nanocrystals results.

In embodiments of the invention the chalcogen oxide comprises selenium dioxide. In embodiments of the invention the fluid can be a reducing solvent such as an olefin, for example, a primary alkene (1-alkene) that has a boiling point that exceeds the highest temperature for crystal growth of the metal chalcogenide. A useful 1-alkene is 1-octadecene (ODE). In the presence of a chalcogen oxide such as $SeO_2$, the olefin functions as a reducing agent during the formation of the metal chalcogenide.

In one embodiment of the invention the chalcogen oxide comprises selenium dioxide and the metal source includes cadmium myristate or cadmium docosanate to form CdSe nanocrystals. The metal source can include different precursors having an identical metal or different metals. Differences in the rates of nucleation and crystal growth of different metal precursors with a common metal can be exploited to control the size and number of nanoparticles produced. In other embodiments of the invention an additional metal complexing solvent, such as 1,2-hexadecanediol (HDD) can be included to modify the nucleation and/or crystal growth rates. In one embodiment of the invention the metal source is lead oleate which forms PbSe nanocrystals upon reaction with $SeO_2$ in ODE. In another embodiment of the invention, $Pd_9Se_2$ nanocrystals are formed by the reaction of palladium (II) acetylacetonate with $SeO_2$ in ODE.

DETAILED DESCRIPTION OF THE INVENTION

Figure 1:
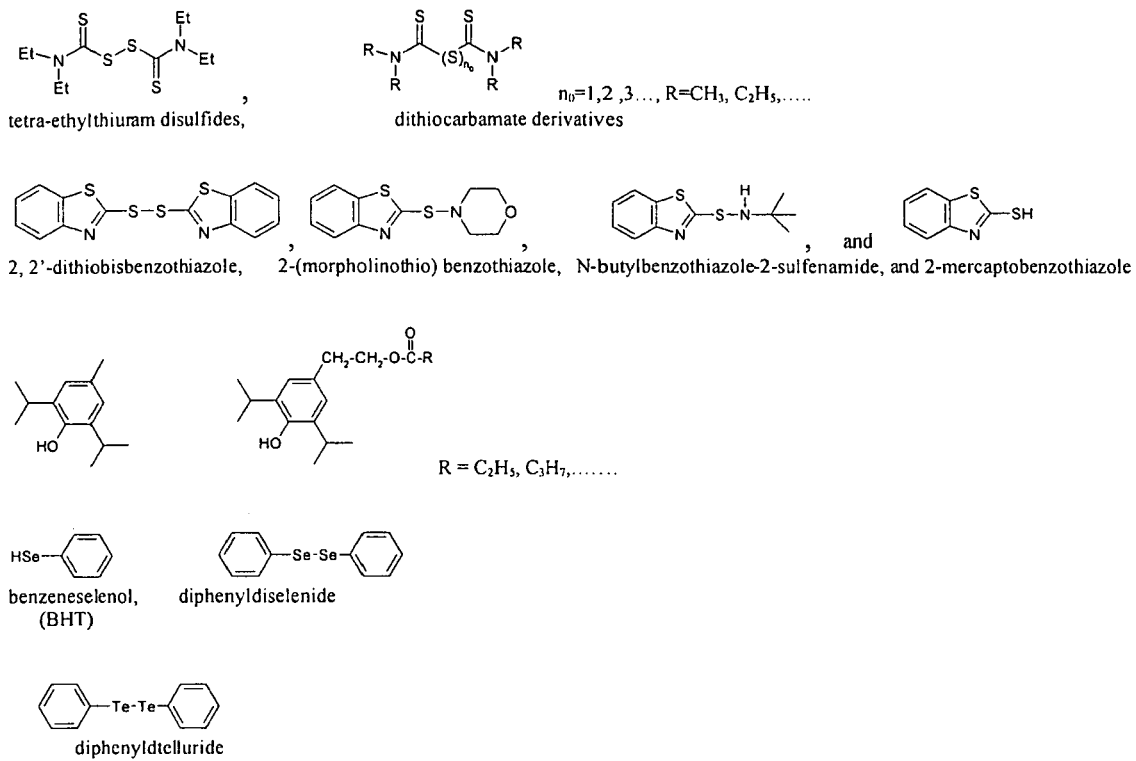
FIG. 1 shows the structure of some exemplary nucleation initiators.

A method of forming metal chalcogenide nanocrystals without precursor injection comprises the steps of combining a metal source, a chalcogenide source, and at least one solvent at a first temperature to form a liquid comprising assembly. The assembly is heated at a sufficient temperature to initiate nucleation to form a plurality of metal chalcogenide nanocrystals. A growing step then follows where the plurality of metal chalcogenide nanocrystals are grown without injection of either the metal source or the chalcogenide source at a temperature at least equal to the sufficient temperature, where growth during the growing step proceeds substantially without nucleation as evidenced by the formation of monodisperse metal chalcogenide nanocrystals.

Although not necessary to practice the claimed invention, Applicant not seeking to be bound, provides the following explanation regarding how the invention permits formation of high-quality monodisperse metal chalcogenide nanocrystals. If the reactivity of metal and chalcogenide source is too low, there are too few nuclei formed, and the subsequent nanocrystal growth is uncontrollable, resulting in a product with poor size distribution. If the reactivity of the metal and chalcogenide source is too high, there is concurrent nucleation and growth occur during the period of increasing temperature of the reaction system again leading to poor size distribution. The invention provides selection of metal and chalcogenide sources and reaction conditions that provides balanced reactivity to provide a sufficient number of nuclei and to allow controllable nanocrystal growth, without the reactivity being high enough to result in concurrent nucleation and growth occur during the period of increasing temperature. Such balanced reactivity according to the invention provides synthesis of high-quality metal chalcogenide nanocrystals.

The invention is thus a new method of controlling the thermodynamics and kinetics of the nanocrystal nucleation and growth stage, and separating the growth stage from the nucleation stage. By balancing the reactivity of the metal and chalcogenide sources as described herein, a plurality of monodisperse metal chalcogenide nanocrystals having uniform shape can be formed. The shapes can be spherical, cubic, rod-like or multi-arm.

For example, the invention can be used to produce a broad range of metal chalcogenide nanocrystals including, but not limited to ZnS, ZnSe, ZnTe, CdSe, CdTe, HgS, HgSe, HgTe, PbS, PbSe, PbTe, SnS, SnSe, SnTe, CdEuS, CdMnS, $Pd_9Se_2$, as well as the metal cations including Fe, Co, Ni, Cu, Ag, in compounds such as FeX, CoX, $Cu_2X$, $Ag_2X$, where X=S, Se or Te.

In an exemplary synthesis using balanced reactivity according to the invention, selenium powder and cadmium myristate are mixed with the coordinating solvent octadecene. The solution is heated to 240° C. at a rate of 25° C./min. No clusters are formed when the temperature is below about 200° C. After the temperature reaches 210° C., small particles (i.e., nuclei) appear. As the particles grow, their size distribution continues to decrease, and a very narrow size distribution is obtained when the temperature reaches 240° C. After the particle diameter reaches about 3.0 nm, an oleic acid-l-octadecene (ODE) solution is added drop-wise into the reaction solution to stabilize the growth of the nanocrystals. Afterward, the narrow size distribution of the nanocrystals can be maintained for at least 16 hours while the nanocrystals continued to grow. No measurable secondary nucleation occurs during the growth stage. Thus, separation of nucleation and growth is achieved.

In addition to octadecene, the solvents can be any solvent where the vapor pressure is low at the highest growth temperature achieved. High boiling primary olefins, such as 1-oxtadecene, are useful as the solvent, where the olefin is weakly coordinating toward the metal cations. Other solvents can be used in place or in addition to the primary olefins. The nucleation and growth steps can be modified by the inclusion with the primary olefin of a second solvent that is a high boiling chelating diol or polyol, such as 1,2-hexadecanediol (HDD).

Chalcogen powder, such as selenium powder, is an exemplary chalcogenide precursor source for balancing the reactivity together which can be used with a metal carboxylic acid precursor source, such as a metal myristate: $C_{14}$-acid to $C_{12}$, $C_{16}$, $C_{18}$, $C_{20}$-acid; oleic acid, palmitoleic acid, myritoleic acid, or metal phosphonates, such as metal phosphonic acids (octadecylphonate: $C_{18}$-acid to $C_{16}$, $C_{12}$, $C_{14}$, $C_{20}$-acid).

Regarding tellurium powder, the reactivity of tellurium powder is very low in the solvent ODE, leading to very few nuclei and which results in uncontrollable crystal growth. However, by using tributylphosphine telluride (TBPTe) instead of tellurium powder as the chalcogen source, with a decreased reactivity cadmium precursor, cadmium octadecylphosphonate (as compared to cadmium myristate) was found to provide monodisperse nanocrystals. No new nucleation was detected during the synthesis, and the size distribution of nanocrystals remained narrow during the whole synthesis process.

The quality of the CdSe and CdTe nanocrystals made as described above is at least comparable with that of those best nanoparticles made by the precursor injection method. The nanocrystals are highly fluorescent and no surface trap emission is found. A typical photoluminescence (PL) quantum yield of band-gap emission is about 30% to 40%. Without size sorting, nanocrystals herein exhibit up to five exciton absorption bands, indicating their very narrow size distributions. This result is consistent with that of TEM measurements taken, where typical nanocrystal samples show sizes with a standard deviation less than 5%.

At least one nucleation initiator is optionally added to the reaction mixture in addition the metal source, chalcogenide source and solvent(s). Although monodisperse nanocrystal distributions according to the invention are possible and are provided herein without nucleation initiators, nucleation initiators can provide enhanced control of the final size of the monodisperse nanoparticle distribution.

As used herein, a "nucleation initiator" is a compound which for a given metal source, chalcogenide source and reaction conditions (e.g. concentrations, temperature, and solvent(s)) controls the number of stable nuclei formed during the heating step where the assembly (metal source, a chalcogenide source, and solvent) is heated at a sufficient temperature to initiate nucleation of a plurality of metal chalcogenide nanocrystals. Preferred nucleation initiators control the rate of growth of the nanocrystal nuclei, and therefore the time (i.e., longer or shorter) of the nucleation stage in the growth solution. Faster nanocrystal growth rates occur with shorter the time for nucleation and yield fewer stable nuclei. In addition, using the same amount of precursors, a smaller number of nuclei results with nanocrystals having a larger final size. Thus, preferred nucleation initiators control the growth rate of the nuclei during both the heating and the growing step, the number of stable nuclei formed during the heating step, and the final size of the nanocrystals.

Nucleation initiators include long-chain fatty amines, long-chain fatty carboxylic acids, long-chain fatty phosphonic acids, long-chain fatty sulfonic acids, and trioctylphosphine, and trioctylphosphine oxide, tributylphosphine, and tributylphosphine oxides. For example, for CdS synthesis, two exemplary nucleation initiators have been used together, tetraethylthiuram disulfide (hereinafter $I_1$) and 2,2'-dithiobisbenzothiazole (hereinafter $I_2$). $I_1$ and $I_2$ have been used as accelerators to increase the reactivity of sulfur in rubber vulcanization for more than 70 years, but not used before for crystal growth. The initiators will generally be different for the synthesis of different materials. Generally, initiators can include the same chalcogenide specie as the chalcogenide specie in the metal chalcogenide being produced.

FIG. 1 shows some exemplary nucleation initiators according to the invention. For metal sulfides, for example, thiazole type (e.g., tetraethylthiuram disulfides) and dithiocarbamate derivatives (e.g., 2,2'-dithiobisbenzothiazole, butylated hydroxytoluene (BHT), and derivatives of the same have been found to be efficient nucleation initiators. Benzeneselenol, diphenyldiselenide, BHT, and derivatives of the same have been found to be efficient initiators for metal selenides. For the metal tellurides, benzenetellunol, diphenylditelluride, BHT, and derivatives of the same have been found to be efficient nucleation initiators. Some carboxylic acids can also be used as nucleation initiators, such as myristic acid.

It has also been found that certain nanocrystals made according to embodiments of the invention, such as CdSe, have a different crystal phase than those made by precursor injection methods (zinc blende vs. wurtzite, respectively). These two crystal structures could produce similar X-ray powder diffraction (XRD) patterns in nanocrystals, but XRD provides unambiguous evidence that the particles are of a zinc-blende structure. CdSe nanocrystals having the zinc-blende crystal phase provide an exciton band structure different from that shown in wurtzite CdSe nanocrystals. Embodiments of the invention provide the ability to tailor the optical and electronic properties of nanocrystals by controlling their crystal phases in addition to controlling their size, shape and surface passivation.

The inventive method has significant importance because it permits a simple way without precursor injection to make nanocrystals on an industrial scale. Uniform size and shape is of great importance for a number of applications such as biological sensing, LEDs, lasers, solar cells, and other optical and electronic devices. For example, regarding biological sensing, inorganic nanocrystal dyes (e.g. for biological labeling) formed using the invention will be attractive alternatives which may replace current organic dyes.

As described above, and in detail below in the Materials and Methods section, to form high-quality nanocrystals from chalcogenide powders, such as selenium powder, air-free operations are required due to the use of air-sensitive compounds, such as selenium precursors: bis(trimethylsilyl)selenium, organophosphine selenide, or selenium powder. The air-free operations increase the complexity and cost of the synthesis of metal chalcogenide nanocrystals. According to an embodiment of the invention, the method can be adapted for making high-quality nanocrystals, for example CdSe nanocrystals, in air by using a chalcogenide oxide, such as $SeO_2$, as the calcogenide precursor. A chalcogen oxide equivalent, such as the acid equivalent to a basic chalcogen oxide, can be used to supply the chalcogenide to the reaction solution. In some embodiments, the chalcogen oxide equivalent can be in equilibrium with the chalcogen oxide.

For example, in one embodiment of the invention, a method for making CdSe nanocrystals involves adding $SeO_2$ and cadmium myristate to a reaction vessel with 1-octadecene, ODE. The resulting mixture is heated to 240° C. at a rate of 25° C./min with agitation. At 240° C. nucleation occurs. As with other chalcogenide sources described above, nucleation and nanocrystal grow, are separated to achieve a narrow size distribution. When the size of nanocrystals achieves a selected size, for example 3.0 nm, oleic acid can be added slowly to the reaction solution to provide additional ligands that stabilize the nanocrystals during growth. The size distribution of nanocrystals remains narrow during particle growth until a final desired size is achieved. Upon further annealing at the reaction temperature, the narrow size distribution of the resulting particles can be maintained for a significant period, for example least overnight. Neither Ostwald ripening nor secondary nucleation is observed during the synthesis. $SeO_2$-based synthesis often exhibits more stable nanocrystal nucleation kinetics than synthesis using selenium powder as a precursor.

Figure 5:
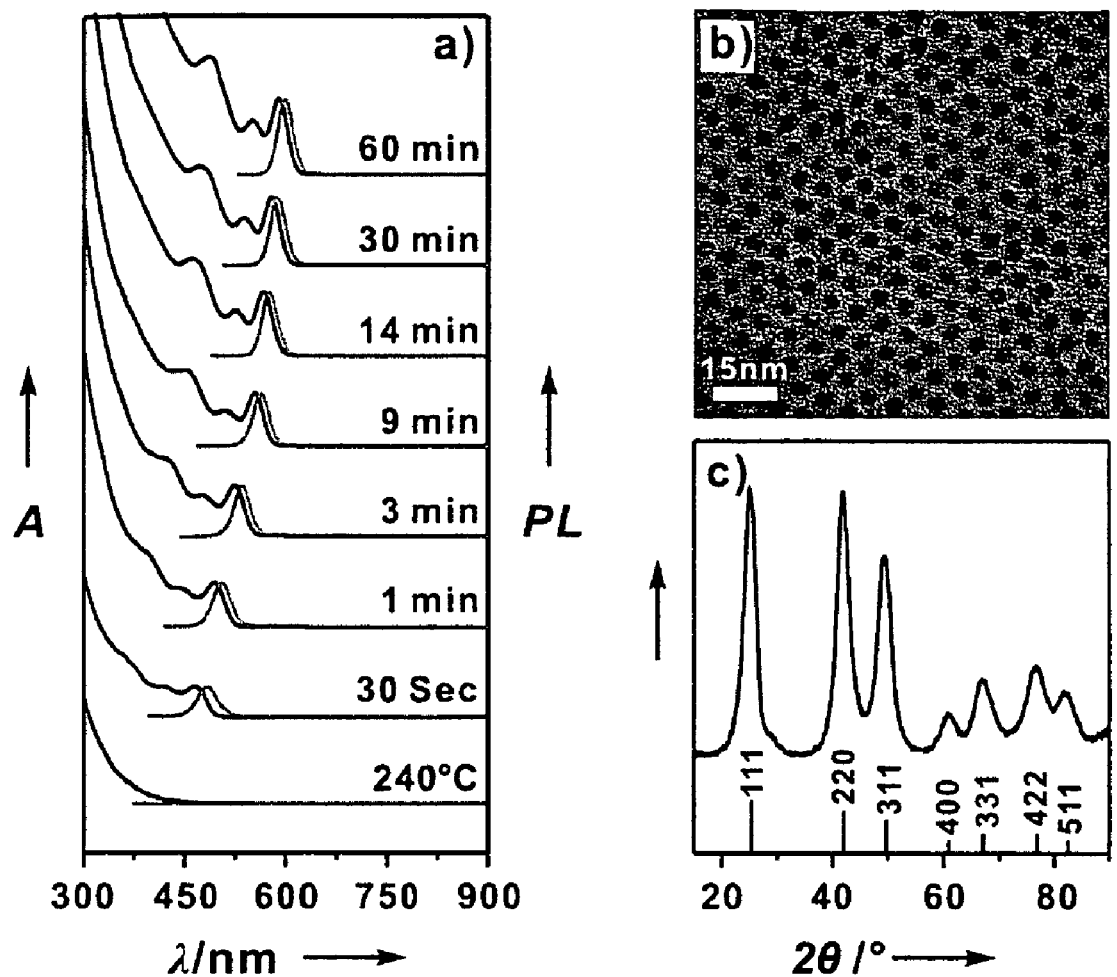
FIG. 5 shows: (a) evolution of the absorption spectrum (black) and photoluminescence (PL) spectrum (gray and truncated before 300 nm) with time after nucleation; (b) a TEM image of 4.0 nm CdSe nanocrystals according to an embodiment of the invention with a standard deviation of ~5%; and (c) an XRD for the CdSe nanocrystals which match the standard XRD peak positions for bulk zinc-blend CdSe indicated on the x-axis.

Without size sorting, typical CdSe nanocrystals from a synthesis from $SeO_2$ exhibit sizes with a standard deviation of about 5% as shown in FIG. 5(b). The X-ray powder diffraction (XRD) pattern, FIG. 5(c), shows that the resulting CdSe nanocrystals have a zinc-blende structure, which is consistent with the absorption spectra of these nanocrystals. The gap between the first ($1S_{3/2}1S_e$) and second ($2S_{3/2}1S_e$) exciton peaks for these CdSe nanocrystals is wider than that of a typical wurtzite particle, but is identical to that for those zinc-blende CdSe nanocrystals made using selenium powders.

Figure 6:
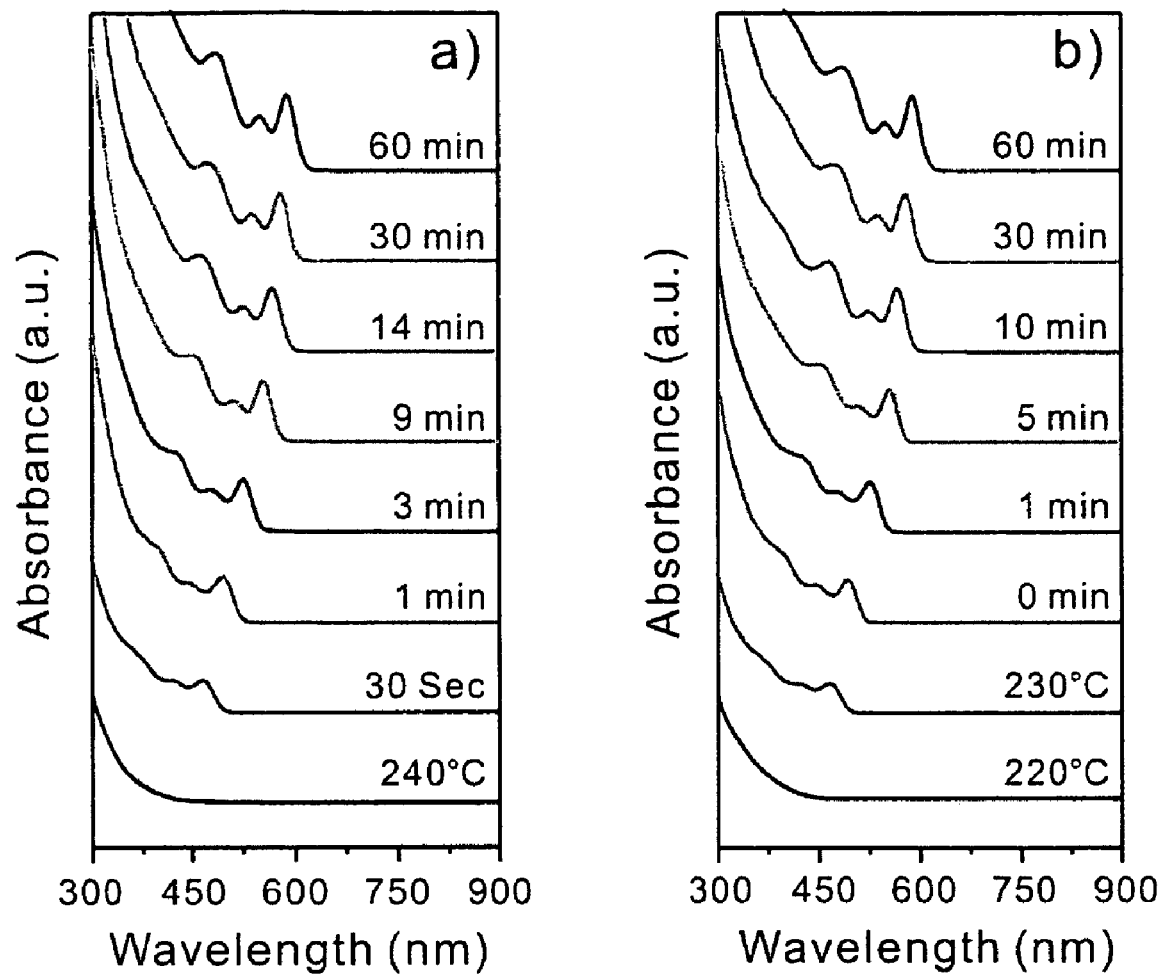
FIG. 6 shows evolution of the absorption spectrum of CdSe nanocrystal growth in air (a) and under Ar (b) where the time zero corresponds to the time when 240° C. was reached.

Unlike the synthesis from other chalcogenide precursors, the presence of oxygen does not negatively effect the formation of CdSe nanocrystals when $SeO_2$ is used as the chalcogenide precursor. FIG. 6 shows the evolution of CdSe nanocrystals in air and under argon. Under Argon, small particles appeared when the temperature reached 230° C. rather than 240° C., but otherwise displays very similar kinetics to yield nanocrystals that are nearly identical in quality even though the presence of oxygen appears to delay the early nucleation stage in CdSe-nanocrystal synthesis. The similarity in the results may be due to oxygen having an extremely low solubility in ODE and that trace amount of oxygen in the reaction solution is consumed at a very early stage of the synthesis.

Figure 7:
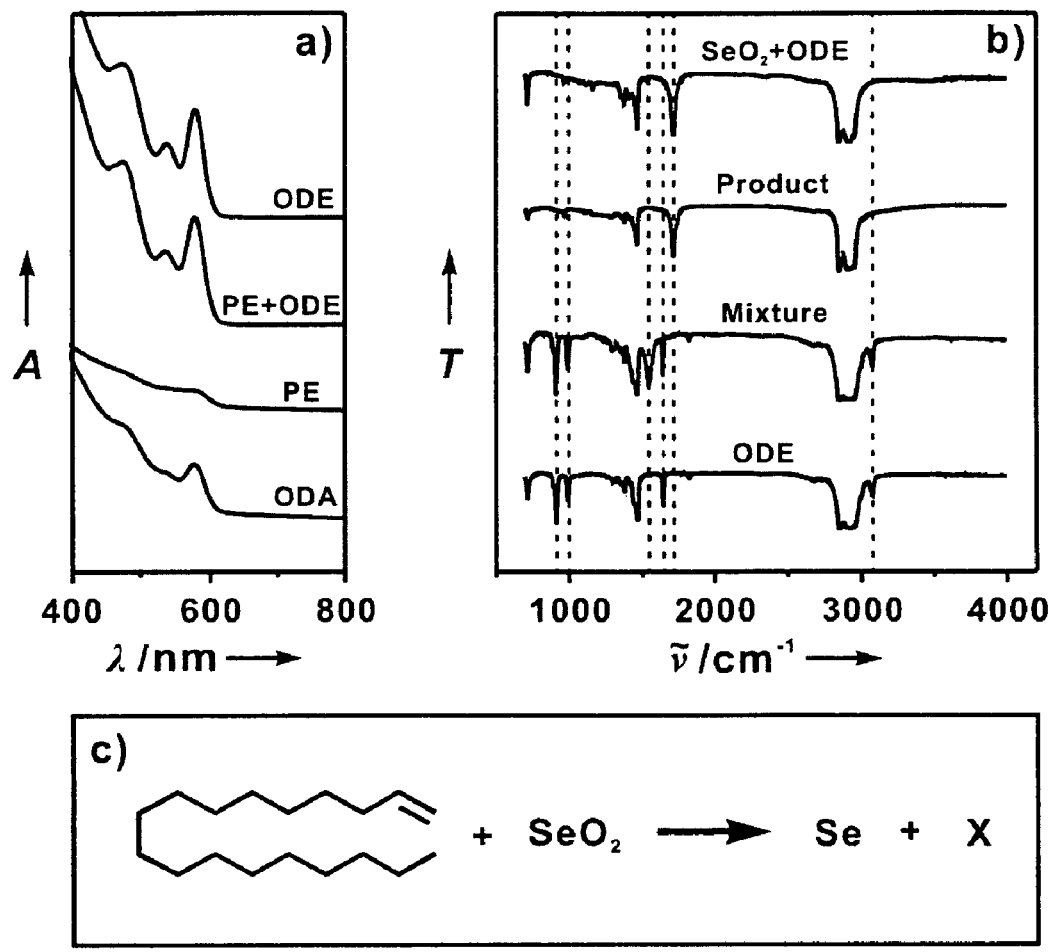
FIG. 7 shows: (a) the absorption spectra of CdSe nanocrystals synthesized in ODA, PE, PE mixed with ODE, and ODE; (b) FT-IR transmittance (T) spectra of ODE, a reaction mixture ($Cd(My)_2$, $SeO_2$ and ODE), the product of the reaction mixture after heating at 240° C., and of the product of the reaction of $SeO_2$ and ODE at 240° C.; and (c) an equation for the reaction between ODE and $SeO_2$ where X represents a mixture of organic by-products.

In this embodiment of the invention, the chalcogenide precursor, for example, $SeO_2$, is reduced to an active form, such as $Se^0$, by the solvent octadecene (ODE). This reducing effect was readily apparent when the ODE was replaced by non-coordinating solvents, octadecane (ODA) and phenyl ether (PE), as shown in FIG. 7. As is apparent in FIG. 7(a) the number of CdSe nuclei formed in ODA is about half of that formed in ODE, and the quality of the resulting particles made in ODA is significantly lower than those made in ODE based on the half width of the first absorbance peaks. Where ODE is replaced by PE, only trace amounts of CdSe particles are formed and the quality of the resulting particles is poor, as indicated in FIG. 7(a). The role of the coordinating solvent, ODE, as a reducing agent is clearly illustrated when a mixed solvent of PE and ODE is employed at a 3:1 molar ratio of ODE to $SeO_2$. UV-Vis spectra show the formation of CdSe nanocrystals from the mixed solvent to be nearly identical in quality as nanocrystals made using pure ODE as the solvent, as indicated in FIG. 7(a).

Figure 8:
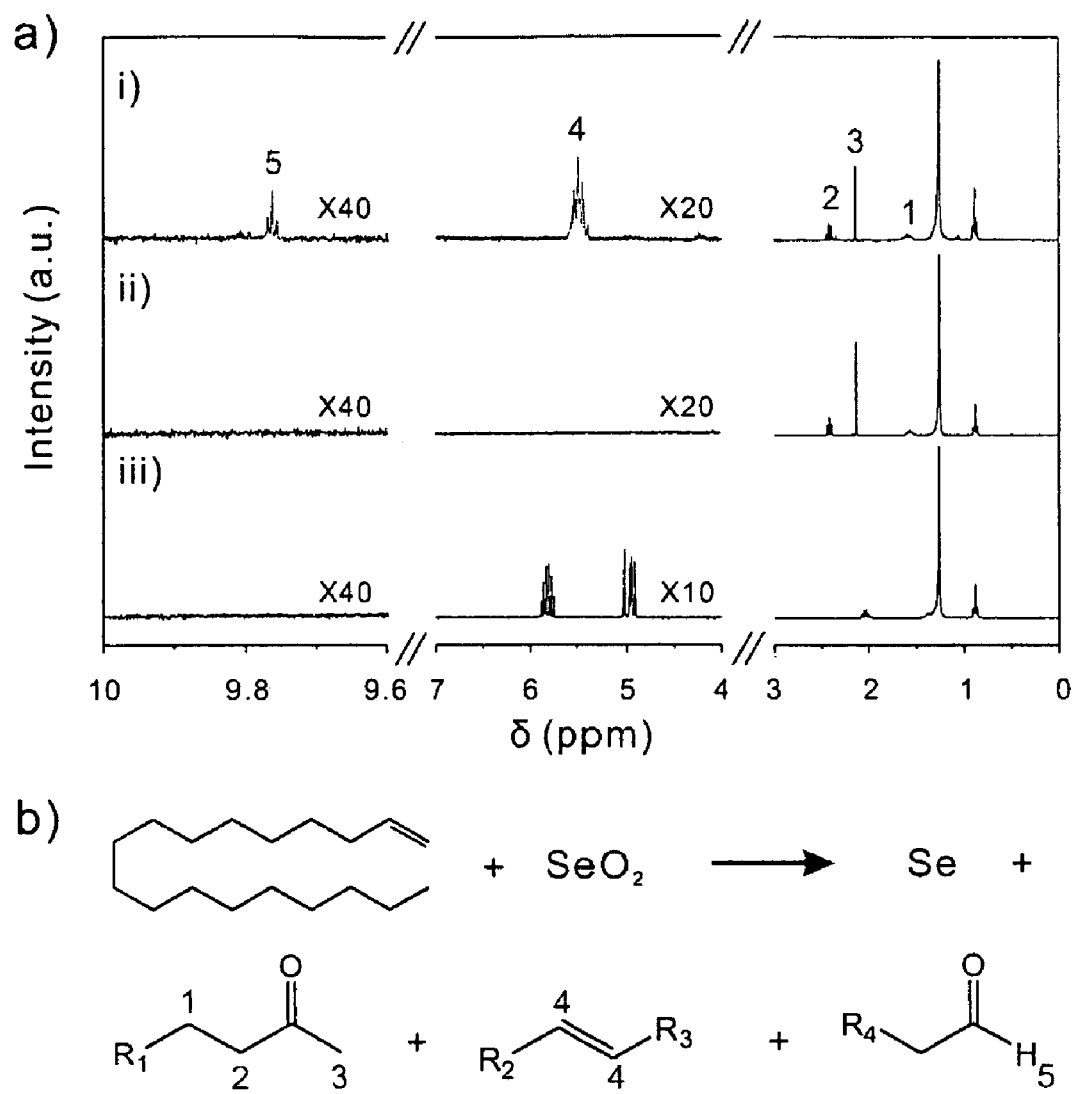
FIG. 8 shows (a) a $^1$H-NMR spectra of (i) the product mixture from the reaction of $SeO_2$ and ODE, (ii) 2-octadecanone, and (iii) ODE for the chemical reaction (b) with numeric assignment of the protons in the product mixture.
Figure 9:
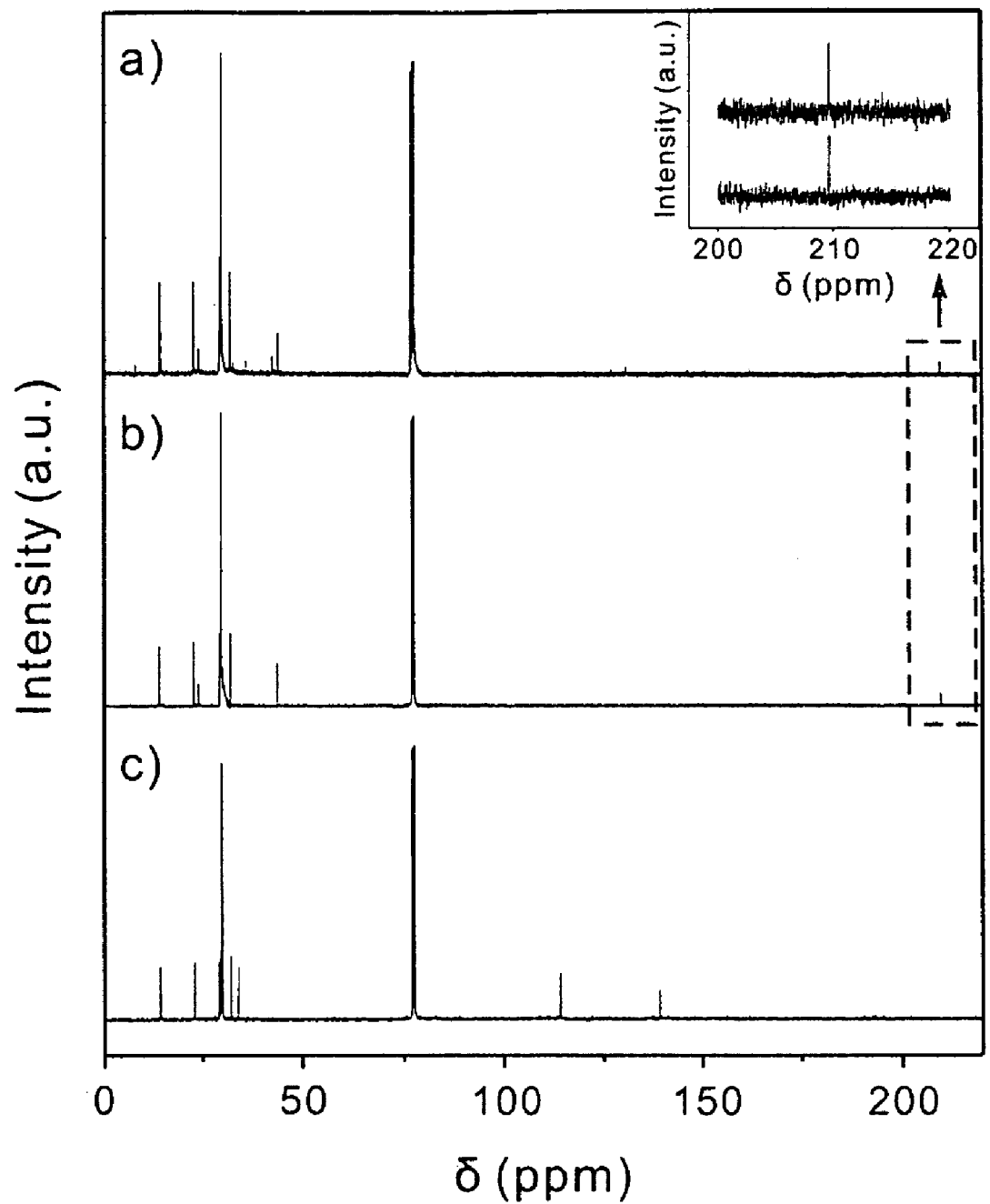
FIG. 9 shows $^{13}$C-NMR spectra of: (a) the product from the reaction of $SeO_2$ and ODE; (b) 2-octadecanone; (c) ODE and inserted spectra of the product and 2-octadecanone from 200 to 220 ppm.

The role of the solvent as a reducing agent of $SeO_2$ is apparent in IR spectra of cadmium myristate and $SeO_2$ in ODE. Prior to any conversion, the reagent mixture exhibited the characteristic IR peaks of the vinyl group of ODE, as can be seen in FIG. 7(b) where the out-of-plane C—H bend at 909.7 $cm^{-1}$ and 991.2 $cm^{-1}$, the C=C stretch at 1641.4 $cm^{-1}$ and the C—H stretch at 3077.6 $cm^{-1}$ are clearly observed. Also, the IR peak due to the carbonyl group of cadmium myristate at 1542.0 $cm^{-1}$ is clearly displayed before reaction. The FTIR spectrum of the resulting reaction product mixture is free of the characteristic IR peaks of ODE and cadmium myristate, while a new IR peak indicating a carbonyl group appears at 1713.2 $cm^{-1}$, as can be seen in FIG. 7(b). A control reaction of $SeO_2$ and ODE free of cadmium myristate displays IR spectral features that are similar to those of the product mixture from this reaction with cadmium myristate (FIG. 7(b)). A $^{13}C$ NMR spectrum of the organic by-product mixture displays signals for a carboxylic acid and ketone. The carboxylic group is consistent with myristic acid, and the ketone appears to be the product of a reaction between ODE and $SeO_2$. Thin-layer chromatography of the CdSe reaction mixture displays a mixture where $^1H$ NMR spectra (FIG. 8(a)) and $^{13}C$ NMR (FIG. 9(a)) are consistent with a composition that includes methyl ketones, a isomerized alkenes with an internal C=C double bond and trace amounts of aldehydes. Methyl ketones and aldehydes are attributed to the products of $SeO_2$-mediated oxidation of the vinyl group of ODE, while the internal alkenes are the isomerization and or dehydrogenation products of ODE mediated by $SeO_2$.

Figure 10:
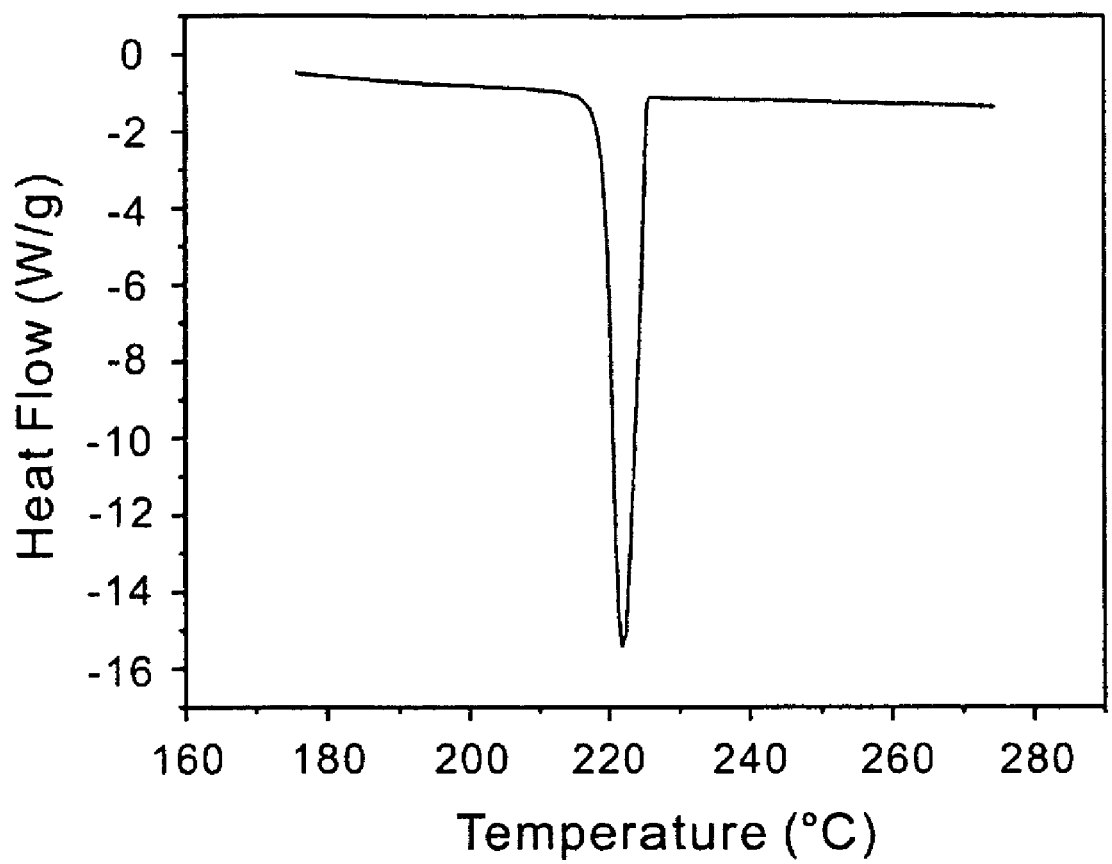
FIG. 10 shows a DSC (differential scanning calorimetry) trace upon thermal scanning of the black precipitates formed from the reaction of $SeO_2$ and ODE, where the melting point of 221° C. indicates the black precipitates are selenium crystals.

The reaction of $SeO_2$ with ODE yields a dark-gray precipitate that exhibits a melting point of 221° C. (FIG. 10), consistent with selenium crystals. Hence, $SeO_2$ appears to be reduced to $Se^0$ when $SeO_2$ is employed as the chalcogenide precursor of CdSe nanocrystal. Furthermore, the formation of $Se^0$ from $SeO_2$ requires a high temperature, thus inhibiting multiple nucleations during the formation of CdSe nanocrystals. This high temperature reduction can account for the very stable nucleation kinetics observed using $SeO_2$ rather than directly using $Se^0$ as the chalcogenide precursor.

The stable nucleation kinetics allows control of the number of nuclei and the final size of the resulting nanocrystals by a $SeO_2$-based synthesis while maintaining the high quality of resulting nanocrystals observed using $Se^0$ in an air-free system. Again, the relationship between nanocrystal growth rate and the number of nuclei in a synthesis of CdS nanocrystals using the $SeO_2$ route is equivalent to that observed with a non-oxide chalcogenide precursor synthesis, as slower nanocrystal growth rates result in larger numbers of nuclei and, therefore, smaller final particle sizes.

Figure 11:
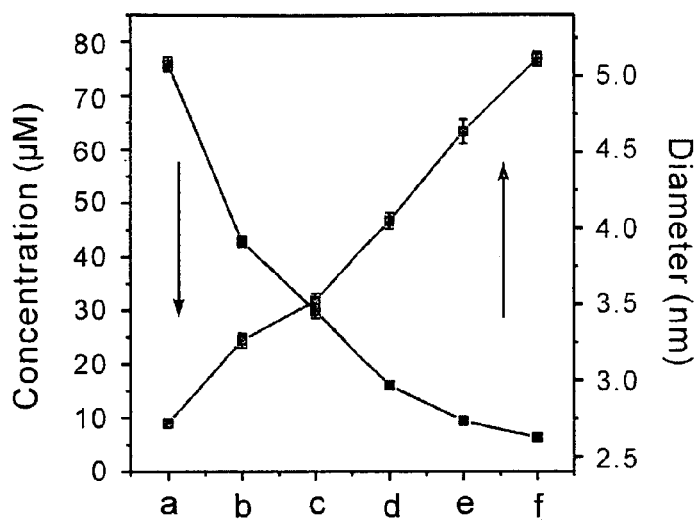
FIG. 11 is a plot of decreasing concentration and increasing size of nanocrystals prepared from reaction mixtures a through f between 0.1 mmol of a Cd salt and 0.1 mmol of $SeO_2$ in 6.3 mL of ODE, where included additional Cd salts or solvents are indicated in Table 1.
Figure 12:
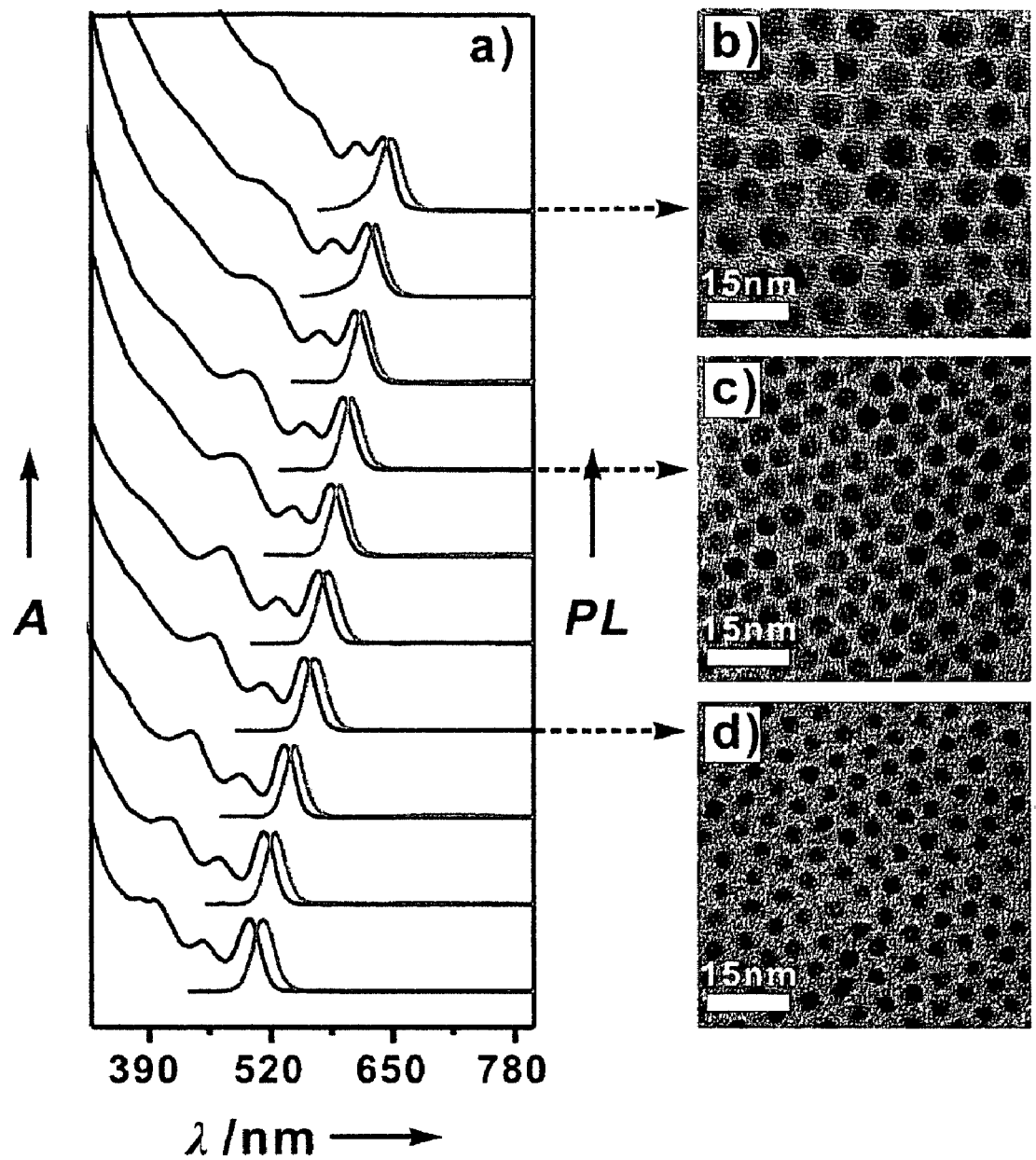
FIG. 12 shows the evolution of (a) Absorption (black) and PL (gray and truncated before 325 nm) spectra of as-prepared CdSe nanocrystals of various sizes and TEM images of CdSe nanocrystals with a diameter of 6.2 nm (b), 4.5 nm (c) and 3.0 nm (d) where a dashed arrow correlates the optical spectra to the TEM of three samples.

Using $SeO_2$ as the chalcogenide precursor allows for control of the nanocrystal growth rate at the nucleation stage for CdSe nanocrystals by tuning the reactivity of cadmium precursors. For example, because of its lower reactivity, cadmium docosanate leads to slower nanocrystal growth rates than that observed for cadmium myristate. Chelation of the cadmium myristate by, for example, HDD can also be used to slow the nanocrystal growth rate, leading to a larger number of nuclei and smaller resulting particles, as illustrated in FIG. 11. Conversely, the introduction of a small amount of a more reactive cadmium precursor, cadmium acetate, increases the nanocrystal growth rate at the nucleation stage and leads to the synthesis of larger CdSe nanocrystals than a synthesis without added cadmium acetate. As can be seen in FIG. 12(b)-(d), high-quality, zinc-blende CdSe nanocrystals with sizes ranging from about 2.0-6.2 μm with a size distribution of ~5% were readily prepared using $SeO_2$ as the chalcogenide precursor. These nanocrystals exhibit a photoluminescence quantum yield of about 40%, and exhibit up to four absorption peaks, indicating their narrow size distribution (FIG. 12(a)).

In addition to olefins, which act as a reducing solvent toward the chalcogen oxide, other solvents, such as a phosphine, for example trialkyl phosphines, or an amine, for example aniline, can be used as a reducing solvent that liberates the chalcogen for formation of the desired metal chalcogenide. As with the olefin, the reducing solvent or any other solvent should not have a boiling point at the pressures in the reaction pot that allows it boils below the maximum temperature at which the growth is carried out. When the maximum temperature and the boiling point of the solvent or mixed solvents are equivalent, the boiling of the solvent can be used to establish a reflux that limits the temperature increase. The fluid used to form the liquid comprising assembly, from which the metal chalcogenide nucleates and grows, can be a solution that contains a reducing agent, for example a solution where the solute is tetrahydroquinone, oxalic acid, tetrabutyltitanate, p-hydroxybenzaldehyde, and/or tetrabutylammonium borohydride.

Figure 13:
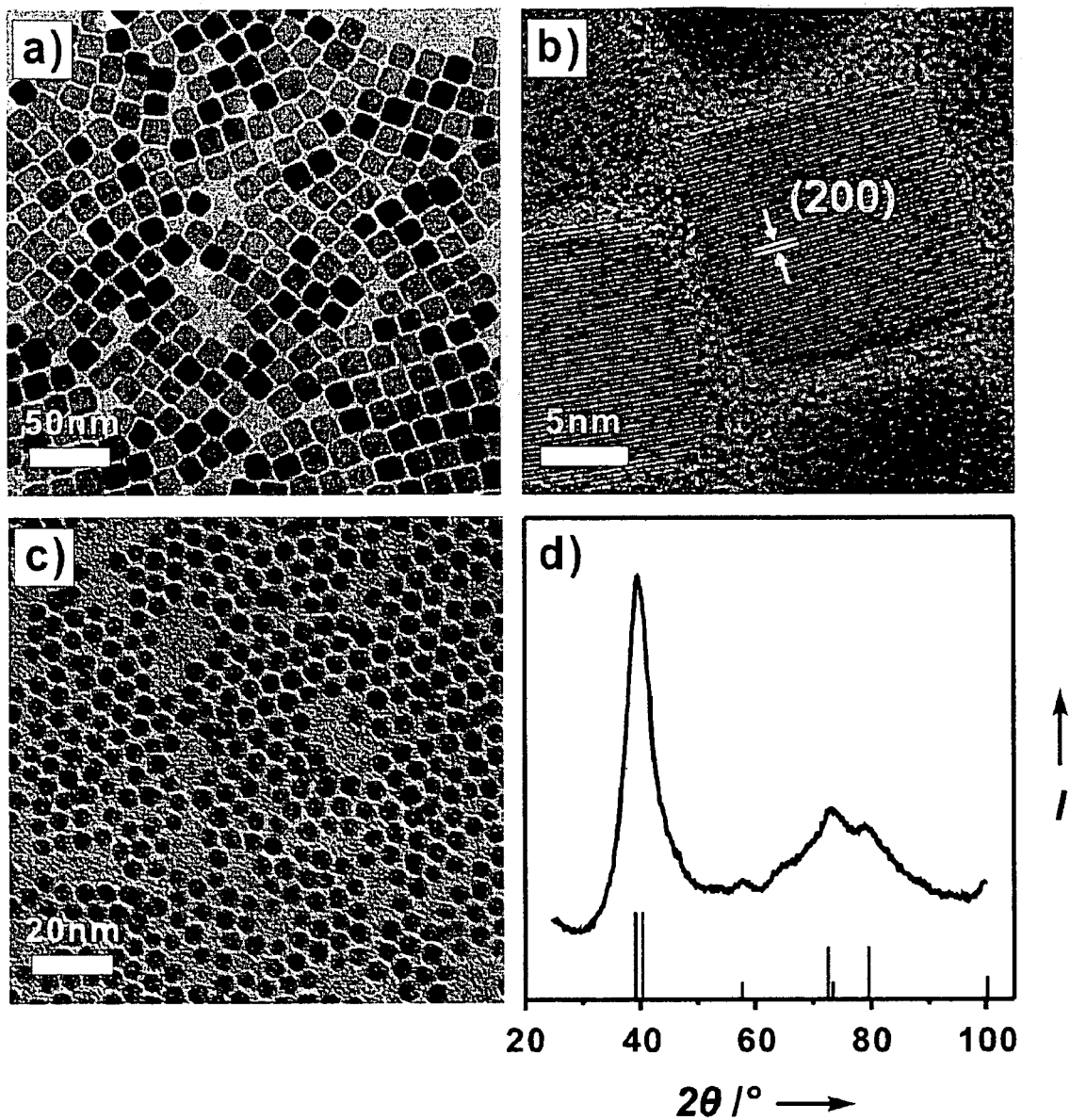
FIG. 13 shows: (a) a TEM image of PbSe nanocubes with a 15.9 nm side length and a standard deviation of 7%; (b) a high-resolution TEM image of PbSe nanocubes indicating the 3.05 Å lattice spacing of the (200) faces in cubic PbSe; (c) a TEM image of $Pd_9Se_2$ nanocrystals; and (d) An XRD pattern of the $Pd_9Se_2$ nanocrystals where the positions of standard XRD peaks for bulk $Pd_9Se_2$ are indicated on the x-axis.
Figure 14:
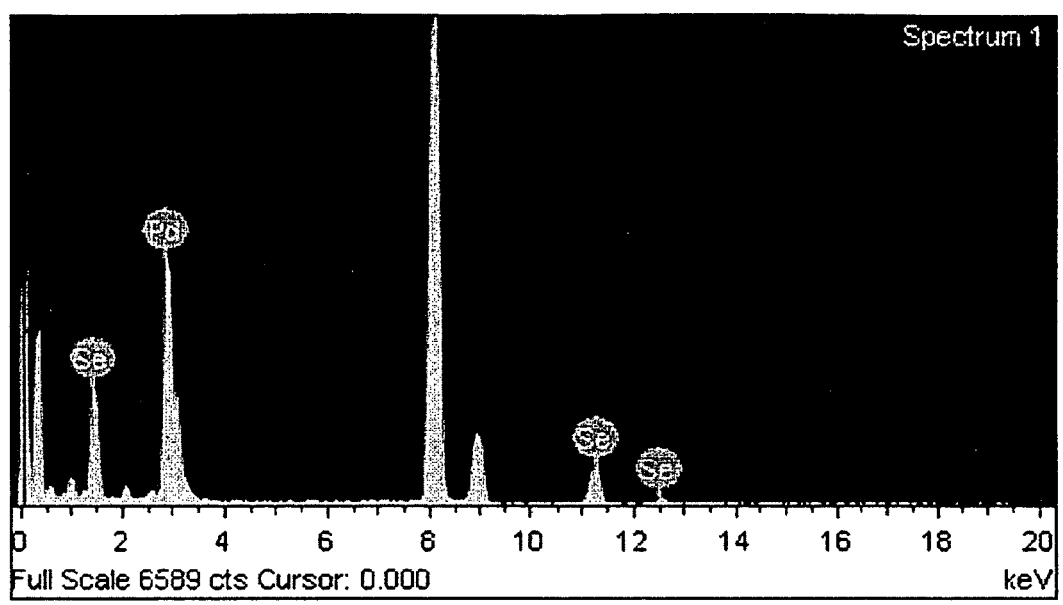
FIG. 14 is an energy-dispersive X-ray spectrum (EDS) of $Pd_9Se_2$ nanocrystals from which the molar ratio of Pd to Se was determined to be 4.5±0.6.

In like manner to the preparation of CdSe nanocrystals using $SeO_2$ as the chalcogenide precursor, lead-selenide and palladium-selenide nanocrystals are readily formed. For the synthesis of PbSe nanocrystals, trioctylphosphine (TOP) was included into the synthetic mixture to stabilize the growth of the PbSe nanocrystals. The resulting PbSe nanocrystals exhibit a cubic shape with edge length of 15.9 nm and a size distribution of 7%, which is illustrated in FIG. 13(a). High-resolution TEM observation shows that these nanocrystals have (200) faces parallel to two edges of these PbSe nanocubes (FIG. 13(b)), which is consistent with the cubic crystal structure of PbSe. Palladium-selenide nanocrystals prepared using TOP and oleyamine as ligands results in the formation of nanocrystals that exhibit a diameter of 4.6 nm with a standard deviation of 7% (FIG. 13(c)). However, by the use of oleyamine, nanocrystals exhibit an atomic molar ratio of palladium and selenium that is 4.5:1 rather than 1:1 by energy dispersive spectroscopy (EDS), shown in FIG. 14. This EDS result is consistent with the XRD measurement, where the Bragg diffraction peaks of these nanocrystals nearly perfectly match those of bulk $Pd_9Se_2$ (FIG. 13(d)).

Methods and Materials

Chemicals

Selenium powder (0.05 mmol, 99.99%, 100 mesh), selenium dioxide ($SeO_2$, 99.9+%), palladium(II) acetylactonate ($Pd(C_5H_7O_2)_2$, 99%), oleic acid (OA, 90%), 1-octadecene (ODE, 90%), octadecane (ODA, 99%), trioctylphosphine (TOP, 90%), oleyamine (70%), docosanoic acid (99%), 1,2-hexadecanediol (HDD, 90%), phenyl ether (PE, 99%), methanol anhydrous (98%) were purchased from Aldrich. Cadmium nitrate tetrahydrate ($Cd(NO_3)_2 \cdot 4H_2O$, 99.99%), cadmium acetate ($Cd(C_2H_3O_2)_2 \cdot 2H_2O$, 99.999%), myristic acid (MA, 99%) were purchased from Alfa Aesar. 2-octadecanone (99%) was purchased from Fluke. Tetrabutylammonium hydroxide (1M in methanol) was purchased from Acros. Lead acetate trihydrate ($Pb(C_2H_3O_2)_2 \cdot 3H_2O$, ACS), sodium hydroxide (NaOH) and all the other solvents were purchased from Fisher Scientific International Inc.

Preparation of Precursors

Cadmium Myristate

Cadmium nitrate (5 mmol) was dissolved in anhydrous methanol (50 mL). A sodium-myristate solution was prepared by dissolving sodium hydroxide (15 mmol) and myristic acid (15 mmol) in anhydrous methanol (500 mL). Then the cadmium-nitrate solution was added dropwise (one drop per second) into the sodium-myristate solution with vigorous stirring. The resulting white precipitate was washed with methanol three times, and then dried at ~60° C. under vacuum overnight.

Cadmium Docosanate

Cadmium nitrate (5 mmol) was dissolved in anhydrous methanol (50 mL). Tetrabutylammonium-docosanate solution was prepared by slowly adding a tetrabutylammonium-hydroxide solution (5 mL, 1M in methanol) into a docosanoic-acid-methanol solution (0.03M, 500 mL). Then the cadmium-nitrate solution was added dropwise (one drop per second) into the tetrabutylammonium-docosanate solution with vigorous stirring. The resulting white precipitate was washed with methanol three times, and then dried at ~60° C. under vacuum overnight.

Nanocrystal Synthesis

CdSe from Se Powder

In a standard nitrogen-protected glove box, 4.0 mg of selenium powder and 5.0 g 1-octadecene (ODE) were mixed in a 25 ml three-neck flask. The mixture solution was stored inside at room temperature for 24 hours. The flask was taken out of glove box and 56.7 mg of cadmium myristate (0.1 mmol) was added. The flask was connected to a Schlenke line and the mixture solution was degassed for 10 min under vacuum (~30 mTorr) at room temperature. Under an argon flow and with stirring, the solution was heated to 240° C. at a rate of 25° C./min.

Figure 2:
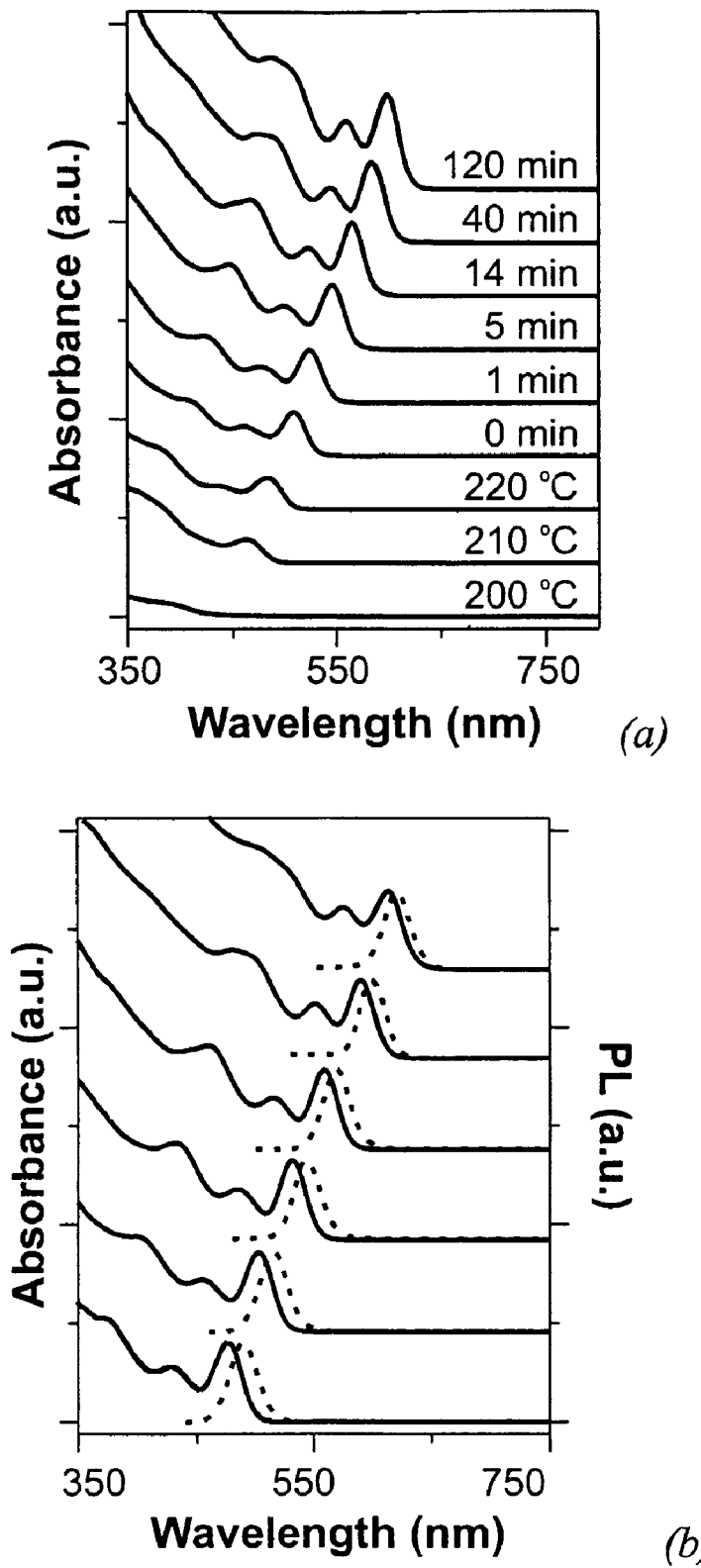
FIG. 2 shows (a) the temporal evolution of a UV-Vis absorption spectrum in CdSe synthesis using selenium powder; (b) absorption (solid line) and PL (dotted line) spectra of as-synthesized CdSe nanocrystals with different sizes using selenium powder as a chalcogenide source.

After the temperature reached 240° C., serial aliquots were taken for kinetic studies. The corresponding UV-Vis absorption spectra of aliquots/toluene solution were shown in FIG. 2(a). The measurements were performed on a Shimadzu UV-vis spectrometer (UV Probe 1701). No clusters were detected when the temperature was below 200° C. After the temperature reached 210° C., small particles (i.e., nuclei) appeared. As the particles grew, their size distribution continued to decrease, and a very narrow size distribution was obtained when the temperature reached 240° C. After the particle diameter reached about 3.5 nm (i.e., the first absorption peak at 574 nm), an oleic acid ODE solution (0.05 mmol, 1.0 ml) was added drop-wise into the reaction solution to stabilize the growth of the nanocrystal. Afterward, the narrow size distribution of the nanocrystals could be maintained for at least 16 hours while the nanocrystals continued to grow. No measurable secondary nucleation occurred during the growth stage. These results show that the separation of nucleation and growth is automatically achieved in this nanocrystal synthesis. They are highly fluorescent and no surface trap emission was found, shown as FIG. 2(b).

Figure 3:
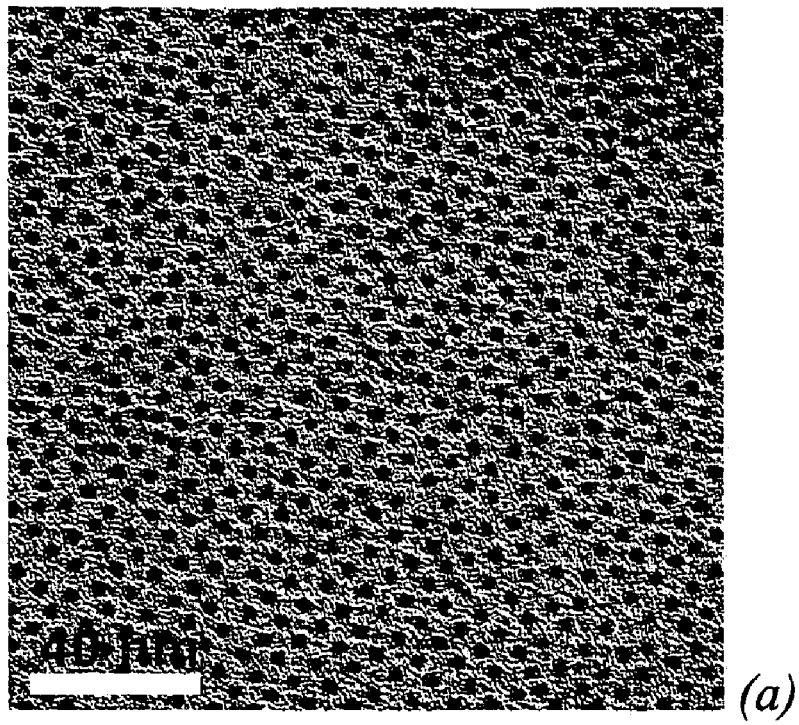
FIG. 3 is (a) a scanned TEM image of CdSe nanocrystal made from selenium powder and (b) a scanned TEM image of a CdSe nanocrystal superlattice.
Figure 3:
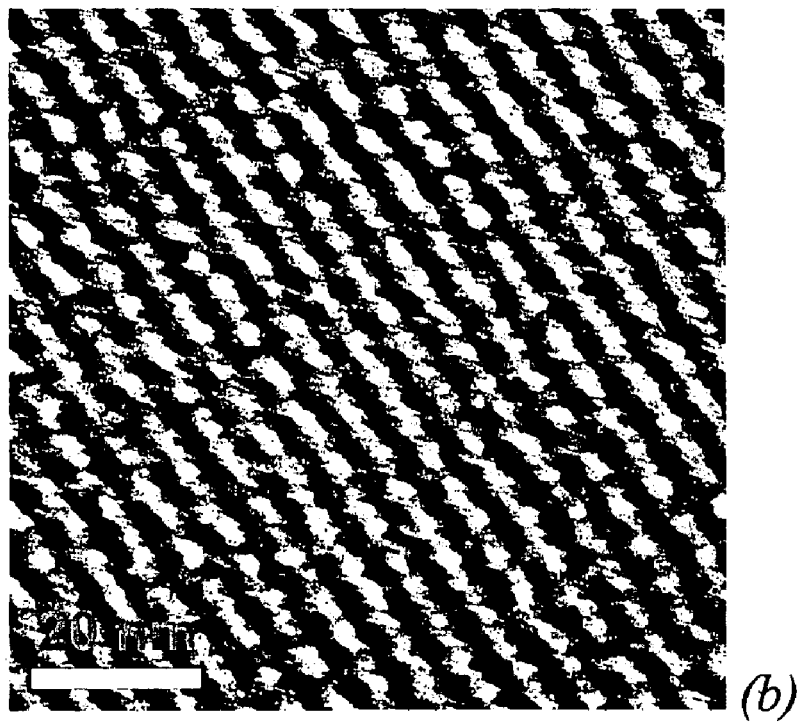

A typical photoluminescence (PL) quantum yield of band-gap emission is about 30% to 40%, compared to 95% of Rodamine-6G dye in ethanol. The fluorescence was measured on a John-Yuvn fluorometer by adjusting their UV-absorbance at the same excitation wavelength is the same (less than 0.05). Without size sorting, nanocrystals herein exhibit up to five exciton absorption bands, indicating their very narrow size distributions. The TEM measurement shown in FIG. 3(a) corroborates this result, which shows a <5% standard deviation of size distribution (average size of 4.0 nm). The TEM sample were made by dropping nanocrystal solution (in a mixture of toluene and hexane) onto 300 mesh or 400 mesh copper grids, and kept in vacuum after drying. FIG. 3(b) shows a large area highly ordered superlattice, implying the narrow size distribution as well, since formation of a superlattice is known to require a high degree of monodipersity. Altogether, these results show that the quality of the CdSe made by this non-injection method is at least comparable with that of those best particles made by the injection method. It is noted that the Se powder method also well applies to the cadmium oleate and cadmium stearate precursors.

Figure 4:
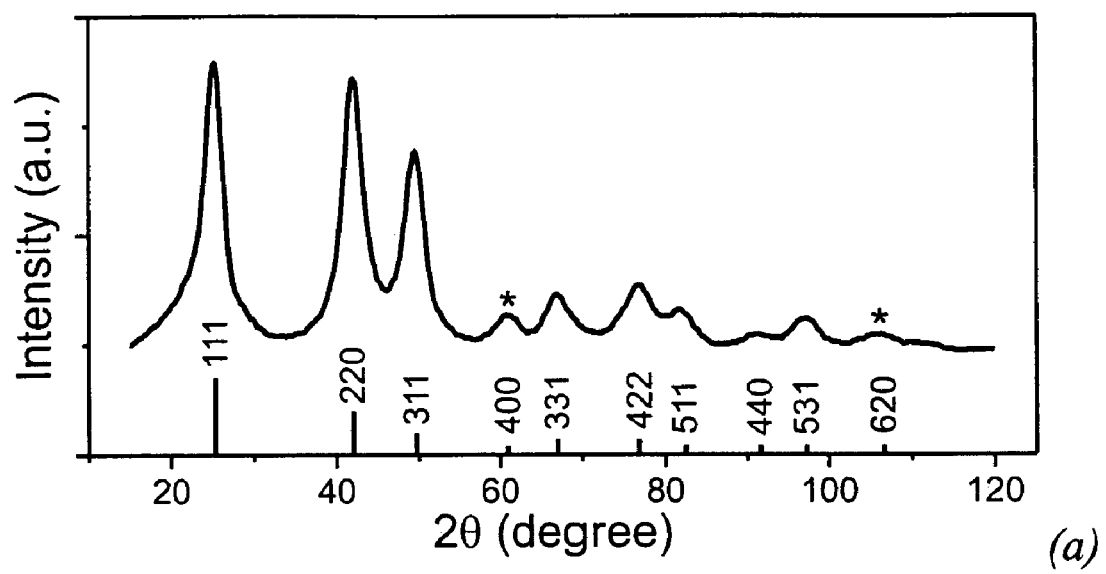
FIG. 4 is (a) an XRD pattern of CdSe nanocrystal monolayer made from selenium powder and (b) a scanned selected area electron diffraction (SAED) pattern of a CdSe nanocrystals superlattice.
Figure 4:
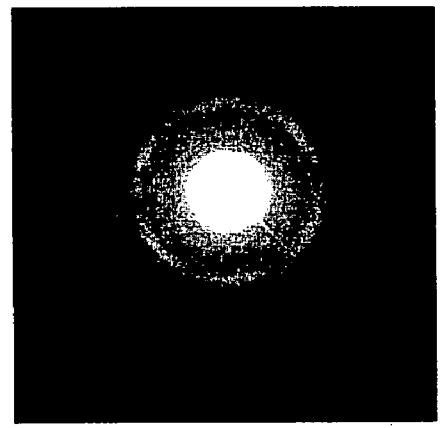

FIG. 4(a) is an X-ray powder diffraction (XRD) pattern of the CdSe nanocrystals made by the inventive non-injection method. It clearly points to the zinc blende structure, because (i) the valley between the (220) and (311) is deep; (ii) the (400) peak is shown at 61.0°; and (iii) the (620) peak is at 106.2°, but in the case of wurtzite crystals, no strong peaks appear in these positions. This structural assignment is consistent with the high-resolution TEM (HRTEM) observation. An orthogonal-cross-fringe pattern shown in the high-resolution image represents an ordered distance of 0.22 nm, corresponding to the lattice spacing of the (220) faces in zinc-blende CdSe. In FIG. 4(b), a selected area electron diffraction (SAED) of CdSe nanocrystals superlattice is provided which shows three diffraction circles corresponding to lattice spacing of 0.22 nm, 0.18 nm and 0.15 nm, which are quite consistent with (220), (311) and (400) faces of zinc blende CdSe structure.

CdSe-Nanocrystal from $SeO_2$ Synthesis under Ar

For a typical synthesis, cadmium myristate (0.1 mmol), $SeO_2$ (0.1 mmol) and ODE (6.3 mL) were mixed in a 25-mL three-neck flask. The resulting mixture was degassed under vacuum (~50 mTorr, 10 min) at room temperature. Under argon flow and with stirring, the mixture was heated to the reaction temperature (240° C.) at a rate of 25° C./min. The time was counted as zero when the temperature reached 240° C. Serial quantitative aliquots (50 μL) were taken for monitoring the kinetics of nanocrystal formation. When the size of nanocrystals reached 3.0 μm, oleic acid (0.1 mL) was added dropwise (one drop per ten seconds) into the reaction solution to further stabilize the nanocrystals. Afterward, the kinetics of nanocrystal growth turned out to be very stable. The size distribution of nanocrystals further narrowed with particle growth, and the narrow size distribution of the resulting particles was maintained for at least overnight. The nanocrystal-formation kinetics in this synthesis are similar to those in the synthesis conducted in air (FIG. 6). In addition, the sizes of the final particles from these two syntheses are nearly identical (~4.0 nm in diameter).

CdSe Nanocrystal Synthesis with Various Final Sizes

For making CdSe nanocrystals of 3.0-3.5 nm in diameter, the synthesis procedure is similar to the typical synthesis described in the main text. Cadmium myristate (0.1 mmol), $SeO_2$ (0.1 mmol), HDD (0.1 mmol) and ODE (6.3 mL) were mixed in a 25-mL three-neck flask. The resulting mixture was then heated to the reaction temperature (240° C.) at a rate of 25° C./min. After 15 min at the reaction temperature, oleic acid (0.1 mL) was added dropwise (one drop per ten seconds) into the reaction solution to further stabilize the nanocrystals. With particle growth, the size distribution of nanocrystals further narrowed. The reaction temperature was maintained for an additional 25-45 min, and then the reaction solution was cooled to room temperature. The resulting nanocrystals were precipitated from the reaction solution using acetone, and were redispersed in toluene. Serial quantitative aliquots (50 μL) were taken for monitoring the kinetics of nanocrystal formation. The number of nanocrystals formed during the synthesis was measured using UV-Vis spectroscopy according to Beer's law.

For making CdSe nanocrystals of 2.8-3.0 nm in diameter, the synthesis procedure is similar to the synthesis described above, except that cadmium myristate was replaced by cadmium docosanate. For making CdSe nanocrystals of 2.0-2.8 nm in diameter, the synthesis procedure is similar to the synthesis described above for nanocrystals of 2.8-3.0 nm except that HDD (0.1 mmol) was added into the reaction system. For making CdSe nanocrystals of 4.0-6.2 nm in diameter, the synthesis procedure is similar to the typical synthesis described above for nanocrystals of 3.0-3.5 nm in diameter, except that cadmium acetate (0.0037-0.017 mmol (1.0 mg-4.7 mg)) was added into the reaction system.

PbSe-Nanocube Synthesis

Lead oleate was prepared as follows: lead acetate trihydrate (1 mmol) was mixed with ODE (4 mL) and oleic acid (1.3 mL) in a 50-mL three-neck flask. The mixture was degassed under vacuum (~50 mTorr) at RT for 10 minutes and then gradually heated to 85° C. and kept for 1 hour to further remove the water and acetic acid. After the mixture turned colorless, the vacuum was removed and the lead-oleate solution was cooled to room temperature. The lead-oleate solution was mixed with TOP (8 mL) and $SeO_2$ (1 mmol). Under argon flow and with stirring, the resulting mixture was heated to 180° C. After 5 min at the temperature, the reaction was terminated by cooling the reaction solution to room temperature. The resulting PbSe nanocrystals were precipitated from the reaction solution using acetone and redispersed in toluene.

$Pd_9Se_2$-Nanocrystal Synthesis

Palladium(II) acetylacetonate (100 mg, 0.33 mmol) and TOP (1 mL) were added into a 25-mL three-neck flask. The mixture was gently stirred for 10 minutes, and an orange solution was formed. Then, $SeO_2$ (36.6 mg, 0.33 mmol), ODE (2 mL) and oleyamine (8 mL) were added into the orange solution. At room temperature, the resulting solution was degassed for 5 min, and then the solution was heated to 250° C. After 10 min at the temperature, the synthesis was terminated by cooling the reaction solution to room temperature. The resulting palladium-selenium nanocrystals were precipitated from the reaction solution using acetone, and redispersed in toluene.

Mechanistic Study

The reaction of cadmium myristate, $SeO_2$, and ODE was conducted as follows: cadmium myristate (2 mmol), $SeO_2$ (2 mmol), and ODE (4 mmol) were mixed in a 10-mL flask. At room temperature, the mixture was degassed under vacuum (~50 mTorr) for 10 min. Under argon flow and with stirring, the mixture was heated to 240° C. After 5 min at the temperature, the reaction solution was cooled to room temperature. About 10 mg of the final yellow-brown mixture was loaded onto a NaCl window for FT-IR measurement, and about 10 mg of the mixture was dissolved in $CD_2Cl_2$ (~0.8 mL) for the $^{13}C$ NMR measurement.

The reaction without cadmium myristate was conducted using a similar procedure as that above: $SeO_2$ (2 mmol) and ODE (4 mmol) were mixed in a 10-mL flask. At room temperature, the mixture was degassed under vacuum (~50 mTorr) for 10 min. Under argon flow and with stirring, the mixture was heated to 240° C. After 5 min at the temperature, the reaction solution was cooled to room temperature. About 10 mg of the final yellow-brown mixture was loaded onto a NaCl window for FT-IR measurement, and about 10 mg of the mixture was dissolved in $CDCl_3$ (~0.8 mL) for $^1H$-NMR, or was dissolved $CD_2Cl_2$ (~0.8 mL) for $^{13}C$ NMR measurements.

TEM and EDS Measurements

TEM measurements were performed on a JEOL 200X operated at 200 kV, or a JEOL 2010F TEM operated at 200 kV. EDS measurements were acquired by the 2010F TEM and operated at 200 kV. The specimens were prepared as follows: a particle solution (10 μL) was dropped onto a 200-mesh copper grid, and was dried overnight at ambient conditions.

XRD Measurements

XRD measurements were performed on a Philips XRD 3720 spectrometer. The specimens were prepared as follows: about 15 mg of the purified nanocrystals were dissolved in about 0.5 mL of toluene and then dropped onto a low-scattering quartz sample-holder and dried in air and kept overnight in a vacuum dessicator.

NMR Measurement $^1H$-NMR analysis was used to identify the chemical compositions of the reaction products. $^1H$-NMR spectra were recorded using a Varian Mercury 300 NMR Spectrometer (300 MHz) and $^{13}C$-NMR spectra were recorded using a Varian Mercury 300BB NMR Spectrometer (300 MHz). For standard samples, about 5 mg of standard sample (ODE or 2-octadecanone) was dissolved in $CDCl_3$ (~0.8 mL) for $^1H$-NMR measurement, and about 10 mg of standard sample (ODE or 2-octadecanone) was dissolved in $CD_2Cl_2$, (~0.8 mL) for $^{13}$C-NMR measurement.

FT-IR Measurement

FT-IR spectra were recorded using a Bruker Vector 22 FT-IR Spectrometer ($\lambda$=633 nm). The specimens were prepared by directly loading about 10 mg of sample onto a NaCl window.

DSC Measurement

DSC diagrams were recorded using a 2910 MDSC instrumentation. About 20 mg of the black precipitate resulting from the reaction between $SeO_2$ and ODE was loaded onto a DSC holder, and gradually heated to 275° C. The heating rate from 175° C. to 275° C. was 2° C./min.

All patents, patent applications, provisional applications, and publications referred to or cited herein, supra or infra, are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A method of forming monodisperse metal chalcogenide nanocrystals without precursor injection, comprising the steps of:
    combining a metal source, a chalcogen oxide or a chalcogen oxide equivalent, and a fluid comprising a reducing agent in one pot at a first temperature to form a liquid comprising assembly;
    increasing the temperature of said assembly to a sufficient-temperature to initiate nucleation to form a plurality of metal chalcogenide nanocrystals, and
    growing said plurality of metal chalcogenide nanocrystals without injection of either said metal source or said chalcogen oxide at a temperature equal to or greater than said sufficient-temperature, wherein crystal growth proceeds substantially without nucleation to form a plurality of monodisperse metal chalcogenide nanocrystals.

2. The method of claim 1, wherein said chalcogen oxide comprises selenium dioxide.

3. The method of claim 1, wherein said metal source provides Zn, Cd, Hg, Pb, Sn, Eu, Mn, Pd, Fe, Co, Ni, Cu, Ag or any combination thereof.

4. The method of claim 1, wherein said metal source comprises cadmium myristate or cadmium docosanate, said chalcogen oxide comprises selenium dioxide, and said metal chalcogenide nanocrystals are CdSe nanocrystals.

5. The method of claim 1, wherein said reducing agent comprises a reducing solvent.

6. The method of claim 5, wherein said reducing solvent comprises a 1-alkene wherein the boiling point of said 1-alkene is equal to or grater than the highest temperature for said crystal growth.

7. The method of claim 6, wherein said 1-alkene is 1-octadecene.

8. The method of claim 1, wherein said solvent further comprises a diol or polyol.

9. The method of claim 8, wherein said diol is 1,2-hexadecanediol.

10. The method of claim 1, wherein said metal source comprises a plurality of different precursors with a common metal or with different metals.

11. The method of claim 10, wherein said plurality of said precursors have different rates of nucleation and crystal growth.

12. The method of claim 10, wherein said precursors with said common metal are cadmium myristate and cadmium acetate.

13. The method of claim 1, wherein said metal source comprises lead oleate, said chalcogen oxide comprises selenium oxide, and said metal chalcogenide nanocrystals are PbSe nanocrystals.

14. The method of claim 1, wherein said metal source comprises palladium (II) acetylacetonate, said chalcogen oxide comprises selenium oxide, and said metal chalcogenide nanocrystals are $Pd_9Se_2$ nanocrystals.

15. The method of claim 1, wherein the steps of combining, increasing and growing are performed in an air atmosphere.

* * * * *

UNITED STATES PATENT AND TRADEMARK OFFICE
CERTIFICATE OF CORRECTION

| | | |
|---|---|---|
| PATENT NO. | : 8,137,457 B2 | |
| APPLICATION NO. | : 12/249586 | |
| DATED | : March 20, 2012 | |
| INVENTOR(S) | : Yunwei Charles Cao and Ou Chen | |

It is certified that error appears in the above-identified patent and that said Letters Patent is hereby corrected as shown below:

Column 11,
Line 15, "3.0 μm" should read --3.0 nm--.

Signed and Sealed this
Eighth Day of May, 2012

David J. Kappos
*Director of the United States Patent and Trademark Office*